United States Patent
Delaporte

(10) Patent No.: US 6,797,889 B1
(45) Date of Patent: Sep. 28, 2004

(54) ASSEMBLY OF POWER CIRCUITS AND NUMERICAL DATA PRINTED ON A MULTILAYER BOARD

(75) Inventor: Francis Delaporte, Osny (FR)

(73) Assignee: Johnson Controls Automotive Electronics, Cergy Pontoise Cedex (FR)

( * ) Notice: Subject to any disclaimer, the term of this patent is extended or adjusted under 35 U.S.C. 154(b) by 0 days.

(21) Appl. No.: 10/158,252

(22) Filed: May 30, 2002

(51) Int. Cl.[7] .................................................. H05K 1/16
(52) U.S. Cl. ..................... 174/260; 174/261; 174/262; 361/760; 361/763; 361/794
(58) Field of Search ................ 174/260, 255, 174/261, 262, 263, 264, 266; 361/760, 792, 793, 794, 795, 761, 763

(56) References Cited

U.S. PATENT DOCUMENTS

| | | | |
|---|---|---|---|
| 4,944,684 A | | 7/1990 | Leibowitz |
| 5,375,039 A | * | 12/1994 | Wiesa ........................ 361/720 |
| 5,384,683 A | * | 1/1995 | Tsunoda ..................... 361/313 |
| 5,394,301 A | * | 2/1995 | Fassel et al. ................ 361/720 |
| 5,488,540 A | * | 1/1996 | Hatta .......................... 361/794 |
| 5,801,925 A | * | 9/1998 | Boada Fonts ............... 361/752 |
| 6,201,696 B1 | * | 3/2001 | Shimizu et al. ............. 361/704 |
| 6,222,732 B1 | * | 4/2001 | Jakob et al. ................. 361/704 |
| 6,232,562 B1 | * | 5/2001 | Kikuchi et al. ............. 174/260 |
| 6,252,179 B1 | * | 6/2001 | Lauffer et al. .............. 174/263 |
| 6,335,866 B1 | * | 1/2002 | Ohtaki et al. ............... 361/784 |
| 6,344,973 B1 | * | 2/2002 | Feustel et al. .............. 361/760 |
| 6,402,530 B1 | * | 6/2002 | Saito et al. ................. 439/76.2 |
| 6,437,986 B1 | * | 8/2002 | Koshiba ..................... 361/752 |
| 6,445,592 B1 | * | 9/2002 | Schirmer .................... 361/762 |
| 6,489,570 B2 | * | 12/2002 | Cheng ........................ 174/255 |
| 6,515,222 B2 | * | 2/2003 | Underwood et al. ...... 174/35 R |

FOREIGN PATENT DOCUMENTS

EP          0 430 157 A2    6/1991

* cited by examiner

Primary Examiner—Kamand Cuneo
Assistant Examiner—I B Patel
(74) Attorney, Agent, or Firm—Foley & Lardner LLP

(57) ABSTRACT

A multilayer circuit assembly includes a power circuit and a numerical data circuit. The power circuit includes a power layer and power components. The numerical data circuit includes a numerical data layer and numerical data components. Power components and numerical data components are incorporated on an external surface of the numerical data layer. Preferably, all of the power components are incorporated on an external face of a numerical data layer. The numerical data layer may be a different thickness than the power circuit layer, and is generally thinner. The assembly may also include an insulating substrate disposed between the power circuit layer and the numerical data layer. The numerical data layer and the power circuit layer may be etched on opposite sides of the insulating substrate. The assembly can also include additional numerical and/or power circuit layers. The power components are typically connected to the power layer using blind vias.

26 Claims, 2 Drawing Sheets

ASSEMBLY OF POWER CIRCUITS AND NUMERICAL DATA PRINTED ON A MULTILAYER BOARD

BACKGROUND

The invention concerns printed circuit boards. Various parameters can distinguish the boards from one another, such as, for example, the thickness of the printed circuit, which becomes larger as the power of the components incorporated in the circuit is large or, conversely, it is thinner when the intensity of the currents circulating in it is low, and the density of the components at the surface of the circuit can be an inverse function of the thickness of the circuit etched on the board. We speak of etching class to describe this density, which is manifested by a certain width of track and of the interval between the tracks. In order to give an idea, in copper with a thickness of 400 µm, one can proceed with etching only class 2, in a 35 µm thickness, class 5, and in an 18 µm thickness, class 6. Class 5 of etching corresponds to a track width of 150 µm and to the same width of the interval between the tracks.

As power components, reference is made here to power connectors, relays, fuses, transistors and other active protective components that are found, for example, in computers in automobiles, motor computers or cockpit computers. Although the invention originates from a problem with automobiles, it is clear that this must not be a limitation of the scope of the present application.

Besides power circuits, generally etched in class 2 or 3, their command and control circuits, in which low currents circulate, with generally numerical signals supports, are found along the bus of multiplex data, for example. The etching of circuits of numerical data is generally done at least in class 5.

The assembly of a power printed circuit board and of a numerical data printed circuit board, for example, but not exclusively, is in an on-board computer, brings about some difficulties: placement of the connecting bar, problem of electromagnetic compatibility, problem of bulkiness, etc.

The aim of the present application is to propose a solution that avoids these difficulties.

BRIEF SUMMARY

For this purpose, an assembly of power circuits and numerical data circuits is provided in which all the circuits are printed on a plurality of layers of different thicknesses, forming a common multilayer board. The multilayer board comprises an external numerical data layer with an external face into which all the components are incorporated.

With the aid of the invention, and in addition, the surface of the conductor is optimized and the manufacture is simplified considerably with methods of supercooling and ripple welding.

It should be pointed out that the components of the internal layers are connected there in the classical manner through blind vias.

In the multilayer board of the invention, external circuit layers of numerical data can be provided surrounding at least two internal power circuit layers.

BRIEF DESCRIPTION OF THE DRAWINGS

The invention will be understood better with the aid of the following description of a special embodiment and with the aid of the diagram of the assembly of the invention, with reference to the attached drawing on which

DETAILED DESCRIPTION

Figure 1:
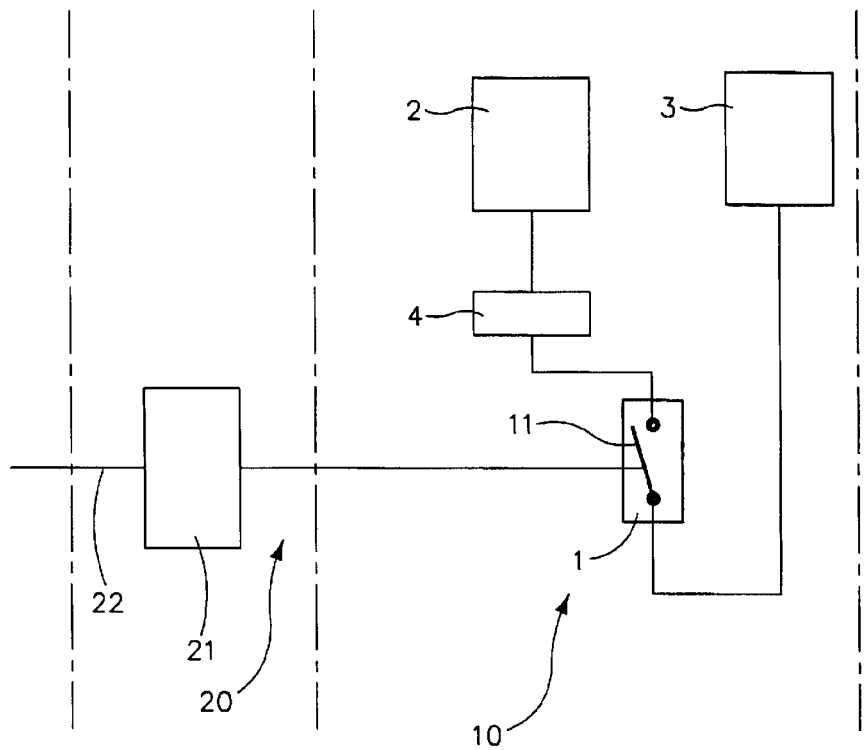
FIG. 1 represents a functional block diagram of a portion of the circuit.

On FIG. 1, a portion of a relay circuit 1 is shown, connected to two power plugs 2, 3 through a fuse 4 for one of these two. These four components constitute the power components of the power circuit portion 10. Coil 11 of relay 1 is controlled through a connector 21 and a numerical data bus 22, in the low-current numerical data components of the data circuit portion 20.

The wiring patterns of the power circuit and the wiring patterns of the numerical data circuit are etched respectively on two sides of an insulating substrate 30, here an epoxy resin, along two layers 31, 32 forming different thicknesses of a common multilayer board 40. The power circuit layer 31 is etched here in class 2 and its thickness is 105 µm; the numerical data circuit layer 32 is etched in class 5, in a thickness of 35 µm.

In the example under consideration, all the components 1, 2, 3,4 , 21, and 22 of the two circuits are incorporated on the same side of the common board 40, on the external face side 33 of the numerical data layer 32.

Figure 2:
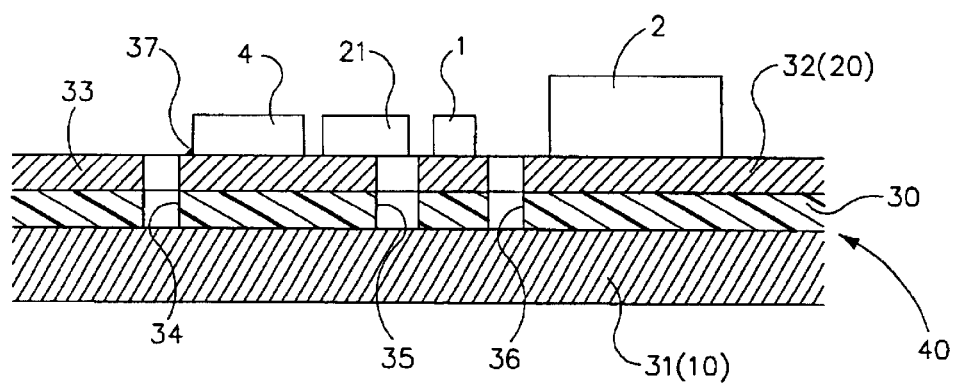
FIG. 2 represents, in cross-section, the corresponding common multilayer board.
Figure 3:
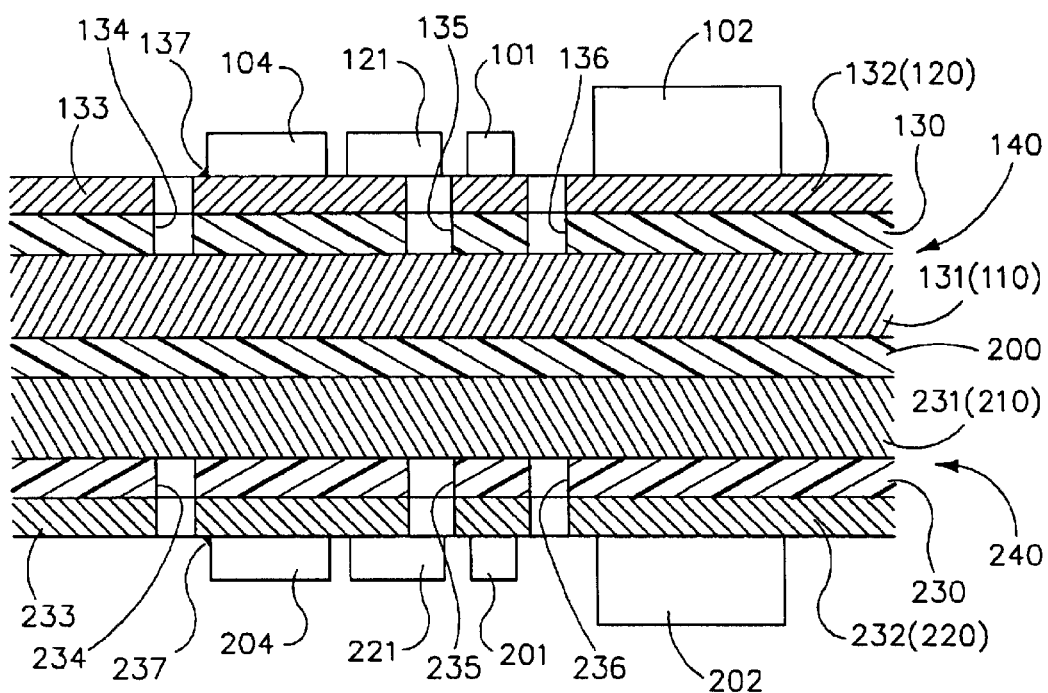
FIG. 3 represents, in cross-section, a common multilayer board with multiple power and data layers.

The power components 1–4 are connected to the power circuit 31 through blind vias, only three (34–36) being visible on the cross-sectional view of FIG. 2. Thus, it can be seen here clearly, for example, that fuse 4 is connected to layer 31 of circuit 10, carrying the wiring pattern of the power circuit, through blind via 34. The weld 37 is obtained with ripple welding.

Board 40 has only two layers. Naturally, the number of layers is not limited. It depends on the applications, it may have two external numerical data layers 132, 232 enclosing an internal power layer 131, 231. In any case, the arrangement disclosed herein may be used for assemblies having a plurality of layers, where the external layers are numerical data circuit layers 132, 232, which are relatively thin, enclosing, for example, at least two internal power circuit layers 131, 231, which are relatively thick, and belong advantageously to etching class equal to or greater than 4.

What is claimed is:

1. A multilayer circuit assembly carrying circuit components, the assembly comprising:

a power circuit layer carrying wiring patterns of a power circuit, the power circuit comprising power components coupled by the wiring patterns of the power circuit layer; and a numerical data circuit layer carrying wiring patterns of a data circuit, the numerical data circuit layer having an external face on which the components of the power circuit and components of the numerical data circuit are incorporated, wherein the thickness of wiring patterns of the power circuit is greater than the thickness of the wiring patterns of the data circuit.

2. The assembly of claim 1, further comprising an insulating substrate disposed between the power circuit layer and the numerical data circuit layer.

3. The assembly of claim 2, wherein the power circuit layer is etched on a first side of the insulating substrate, and the numerical data circuit layer is etched on a second side of the insulating substrate opposite the first side.

4. The assembly of claim 1, further comprising a second numerical data circuit layer,
wherein the numerical data circuit layer is disposed on a first side of the power circuit layer and the second numerical data circuit layer is disposed on a second side of the power circuit layer opposite the first side.

5. The assembly of claim 4, further comprising a second power circuit layer that is disposed between the power circuit layer and the second numerical data circuit layer.

6. The assembly of claim 5, wherein the power circuit layer and the second power circuit layer belong to an etching class equal to or greater than 4.

7. The assembly of claim 1, wherein the power circuit layer is thicker than the numerical data circuit layer.

8. The assembly of claim 1, wherein the power circuit layer is etched in class 2 or 3.

9. The assembly of claim 8, wherein the power circuit layer is about 105 micrometers thick.

10. The assembly of claim 1, wherein the numerical data circuit layer is etched in at least class 5.

11. The assembly of claim 10, wherein the numerical data circuit layer is about 35 micrometers thick.

12. The assembly of claim 1, wherein a power plug, a relay circuit, and a connector that connects to a numerical data bus are incorporated on the external face of the numerical data circuit layer.

13. The assembly of claim 1, wherein the power circuit layer and the numerical data circuit layer are etched on the insulating substrate.

14. The assembly of claim 1, wherein the components of the power circuit are coupled to the power circuit layer by blind vias.

15. The assembly of claim 1, wherein all of the components of the power circuit are incorporated on an external face of a data circuit layer.

16. A multilayer assembly comprising:
a means for providing a power circuit;
an insulating substrate; and
a means for providing a numerical data circuit;
wherein the means for providing a numerical data circuit comprises an external face on which power components of the power circuit and components of the numerical data circuit are disposed,
wherein the thickness of the means for providing the power circuit is greater than the thickness of the means for providing the numerical data circuit.

17. The assembly of claim 16, wherein the insulating substrate is an epoxy resin.

18. An electronic system of an automobile, comprising:
a multilayer circuit assembly coupled to the automobile and carrying circuit components, the assembly comprising,
a power circuit layer comprising wiring patterns of a power circuit, the power circuit comprising power components coupled by the wiring patterns of the power circuit layer; and
a numerical data circuit layer comprising wiring patterns of a data circuit, the numerical data circuit layer having a face on which the power components and components of the numerical data circuit are disposed,
wherein the thickness of wiring patterns of the power circuit is greater than the thickness of the wiring patterns of the data circuit.

19. The automobile system of claim 18, wherein the assembly further comprises an insulating substrate disposed between the power circuit layer and the numerical data circuit layer.

20. The automobile system of claim 19, wherein the power circuit layer is etched on a first side of the insulating substrate, and the numerical data circuit layer is etched on a second side of the insulating substrate opposite the first side.

21. The automobile system of claim 18, wherein the assembly further comprises a second numerical data circuit layer,
wherein the numerical data circuit layer is disposed on a first side of the power circuit layer and the second numerical data circuit layer is disposed on a second side of the power circuit layer opposite the first side.

22. The automobile system of claim 21, wherein the assembly further comprises a second power circuit layer that is disposed between the power circuit layer and the second numerical data circuit layer.

23. The automobile system of claim 22, wherein the power circuit layer and the second power circuit layer belong to an etching class equal to or greater than 4.

24. The automobile system of claim 18, wherein the power circuit layer is etched in class 2 or 3.

25. The automobile system of claim 18, wherein the numerical data circuit layer is etched in at least class 5.

26. The automobile system of claim 18, wherein the power components comprise a power plug, a relay circuit, and a connector that connects to a numerical data bus, and are incorporated on the external face of the numerical data circuit layer.

* * * * *